United States Patent
Grodzki

(10) Patent No.: US 9,933,497 B2
(45) Date of Patent: Apr. 3, 2018

(54) METHOD AND MAGNETIC RESONANCE APPARATUS FOR DETERMINATION OF EXCITATION PROFILES FROM EXCITATION PULSES

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 468 days.

(21) Appl. No.: 14/501,358

(22) Filed: Sep. 30, 2014

(65) Prior Publication Data

US 2015/0091565 A1   Apr. 2, 2015

(30) Foreign Application Priority Data

Sep. 30, 2013   (DE) .......................... 10 2013 219 747

(51) Int. Cl.
| | |
|---|---|
| G01R 33/32 | (2006.01) |
| G01R 33/54 | (2006.01) |
| G01R 33/24 | (2006.01) |
| G01R 33/483 | (2006.01) |
| G01R 33/58 | (2006.01) |

(52) U.S. Cl.
CPC ........... *G01R 33/32* (2013.01); *G01R 33/246* (2013.01); *G01R 33/4833* (2013.01); *G01R 33/54* (2013.01); *G01R 33/583* (2013.01)

(58) Field of Classification Search
CPC ...... A61B 5/055; A61B 5/7203; G01R 33/48; G01R 33/4816; G01R 33/565; G01R 33/583; G01R 33/58
See application file for complete search history.

(56) References Cited

U.S. PATENT DOCUMENTS

| | | |
|---|---|---|
| 5,416,412 A | 5/1995 | Slayman et al. |
| 2007/0013374 A1 | 1/2007 | Griswold et al. |
| 2011/0054299 A1* | 3/2011 | Ling ..................... A61B 5/055 600/410 |

(Continued)

OTHER PUBLICATIONS

"Correcting Slice Selectivity in Hard Pulse Sequences," Grodzki et al., Journal of Magnetic Resonance, vol. 214 (2012), pp. 61-67.

*Primary Examiner* — Clayton E Laballe
*Assistant Examiner* — Ruifeng Pu
(74) *Attorney, Agent, or Firm* — Schiff Hardin LLP

(57) ABSTRACT

In a method for determining excitation profiles from excitation pulses in a magnetic resonance, a homogeneous phantom is placed within the measurement volume of the magnetic resonance apparatus, at least one measurement data set of the phantom is acquired by operating the apparatus with a test pulse sequence composed of one excitation pulse, of which the excitation profile is to be determined, and a test gradient that is already activated on at full strength while the excitation pulse (A) is irradiated. The intensity profile of at least one acquired measurement data set in the direction in which the test gradient was switched on is determined in a processor, and the excitation profile of the excitation pulse is determined from the calculated intensity profile. The determined excitation profile is saved.

10 Claims, 4 Drawing Sheets

(56) References Cited

U.S. PATENT DOCUMENTS

| | | | |
|---|---|---|---|
| 2013/0096415 A1* | 4/2013 | Ruff | A61B 5/14546 600/410 |
| 2013/0101198 A1* | 4/2013 | Grodzki | G01R 33/4816 382/131 |
| 2015/0091568 A1* | 4/2015 | Grodzki | G01R 33/4822 324/309 |
| 2016/0061922 A1* | 3/2016 | Grodzki | G01R 33/5608 324/309 |

* cited by examiner

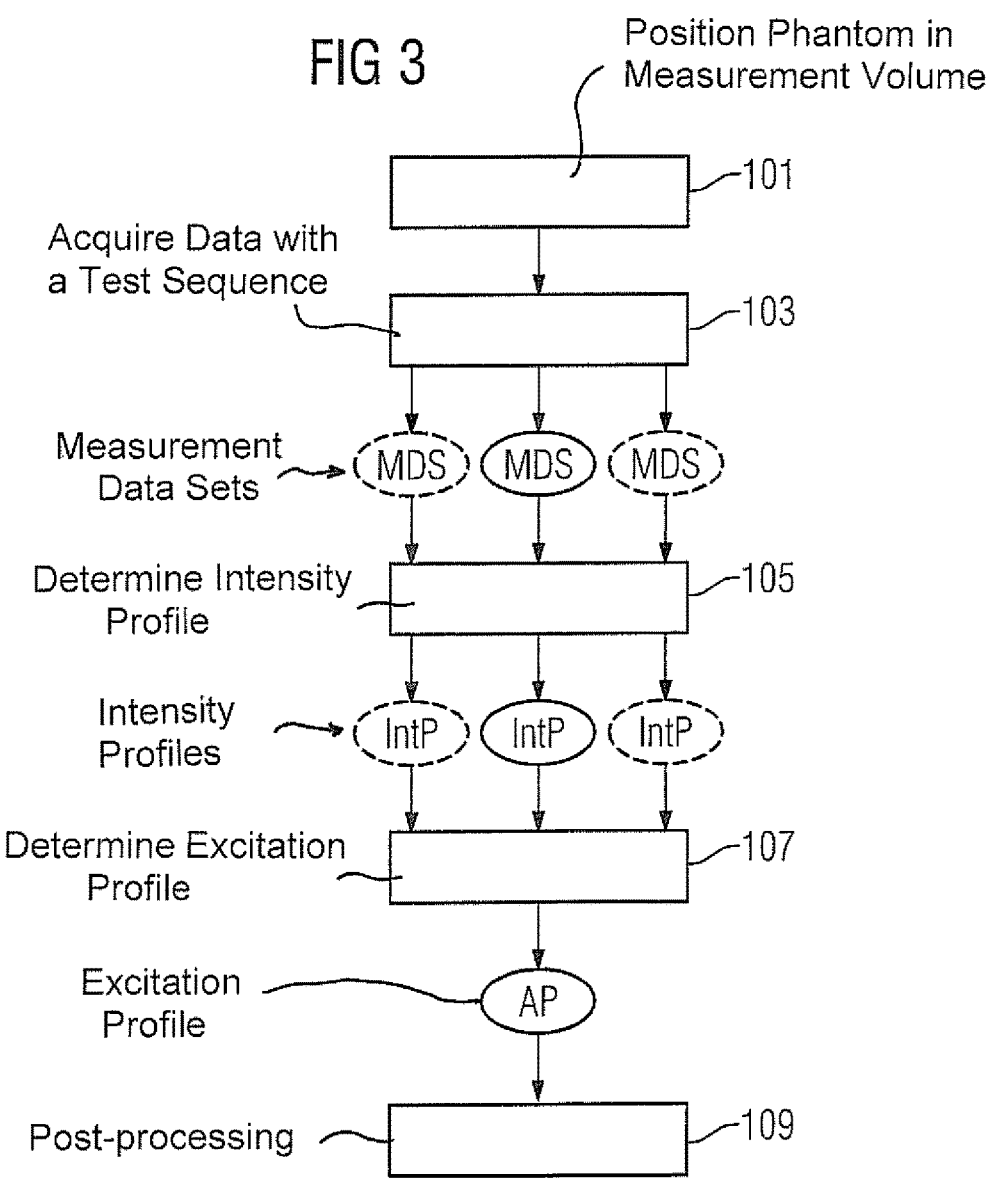

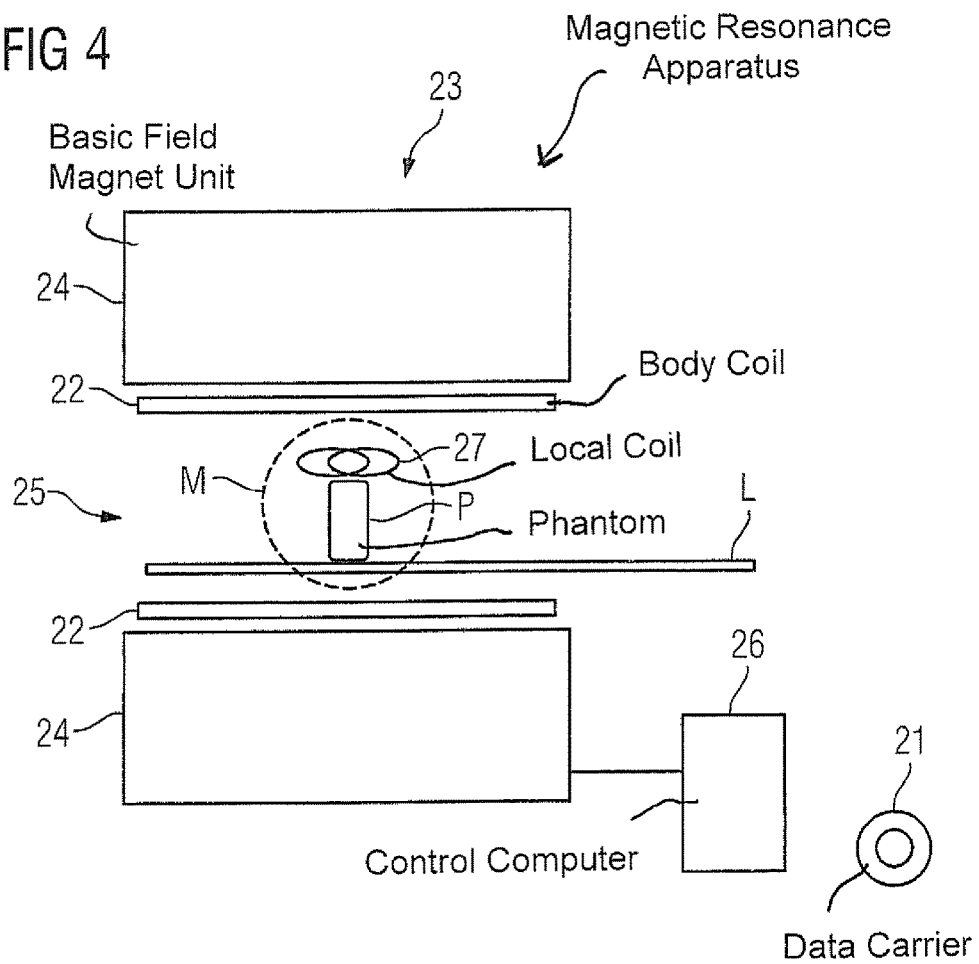

METHOD AND MAGNETIC RESONANCE APPARATUS FOR DETERMINATION OF EXCITATION PROFILES FROM EXCITATION PULSES

BACKGROUND OF THE INVENTION

Field of the Invention

The invention refers to the determination of excitation profiles from excitation pulses in magnetic resonance.

Description of the Prior Art

Magnetic resonance (MR) technology (also called magnetic resonance imaging), is a well-known modality, with which images can be made of the inside of an object under examination. In simple terms, the object under examination is positioned in a magnetic resonance device in a relatively strong static, homogeneous basic magnetic field, also called B0-field, with field strengths ranging from 0.2 Tesla to 7 Tesla and more, so that nuclear spins in the subject are aligned along the basic magnetic field. In order to trigger nuclear spin resonances, radio-frequency excitation pulses (RF-pulses) are irradiated, and the triggered nuclear spin resonances are measured as so-called k-space data and MR-images are reconstructed or spectroscopic data are determined from the k-space data. For spatial coding of the measured data, the basic magnetic field is superimposed with rapidly changing magnetic gradient fields, also simply called gradients. The recorded data that are measured is digitalized and entered as complex number values in a memory organized as a k-space-matrix. From the k-space-matrix which is filled with values, it is possible to reconstruct an MR-image e.g. via a multidimensional Fourier-transformation.

Some MR-sequences use a non-selective excitation pulse, which is simultaneously applied with activated imaging gradients. Examples are the PETRA-sequence and the Silenz-sequence. The PETRA-sequence, as well as the Silenz-sequence, has the special feature of allowing for a particularly quiet imaging.

Such a non-selective excitation with activated gradients, however, has disadvantages. A specific slice selection is not possible; rather, an undesired slice selection is performed by the activated gradient at the time of the excitation, when the object that is to be measured is superimposed with the excitation profile of the pulse.

This undesired slice selection can be solved within the constraints of certain limitations, as described, e.g. in the United States Patent Application Publication No. 2013/0101198 A1. In such procedures, the exact knowledge of the actually executed excitation is important.

The excitation pulse that is used in the aforementioned sequences is usually a well-defined, rectangular-shaped pulse with an extremely short duration (e.g. 14 µs at a flip angle of 6°). Due to technical reasons, the shape of the pulse that is actually applied by the magnetic resonance device is generally slightly different from the theoretically desired rectangular-shaped pulse. The deviations from the desired shape of the pulse differ depending on the kind of magnetic resonance system and the implemented software.

SUMMARY OF THE INVENTION

An object of the present invention is to provide a simple and fast determination of excitation profiles from excitation pulses in magnetic resonance, which can easily be performed on different existing magnetic resonance systems.

This object is achieved by a procedure for determining excitation profiles from excitation pulses in a magnetic resonance device according to the invention that includes the following steps:

A homogeneous phantom is placed within the measurement volume of the magnetic resonance device apparatus.

At least one measurement data set of the phantom is acquired by operating the magnetic resonance apparatus with a test pulse sequence, which includes one excitation pulse of which the excitation profile is to be determined, with a test gradient being already activated at full strength while the excitation pulse is irradiated.

In a processor, the intensity profile of at least one recorded measurement data set is determined in the direction in which the test gradient was activated.

In the processor, the excitation profile of the excitation pulse is determined from the calculated intensity profile.

The determined excitation profile is stored.

The procedure according to the invention allows for a quick determination of excitation profiles with very high precision, which can easily be performed with different magnetic resonance systems. The saved excitation profiles can easily be integrated into the above mentioned correction procedure, suitable for every magnetic resonance system.

When the test gradient is activated in a read-out direction, a high resolution of the excitation profile can already be achieved in the read-out process, during a repetition of the sequence.

By averaging individual intensity profiles of the measured data sets are in the determination of the intensity profile, a particularly high accuracy can be accomplished and it is possible to achieve a lower susceptibility to coil intensity, excitation differences.

A magnetic resonance apparatus according to the invention has a control unit that is designed to operate the procedure according to the invention.

The invention also encompasses a non-transitory, computer-readable data storage medium encoded with programming instructions that cause a magnetic resonance apparatus to implement the method according to the invention, when the data storage medium is loaded into a control computer of the magnetic resonance system.

The described advantages and embodiments with regard to the method are equally applicable to the magnetic resonance apparatus as well as the electronically readable data storage medium.

BRIEF DESCRIPTION OF THE DRAWINGS

FIG. 3 is a schematic flowchart of an embodiment of the method according to the invention.

FIG. 4 schematically illustrates a magnetic resonance apparatus according to the invention.

DESCRIPTION OF THE PREFERRED EMBODIMENTS

Figure 1:
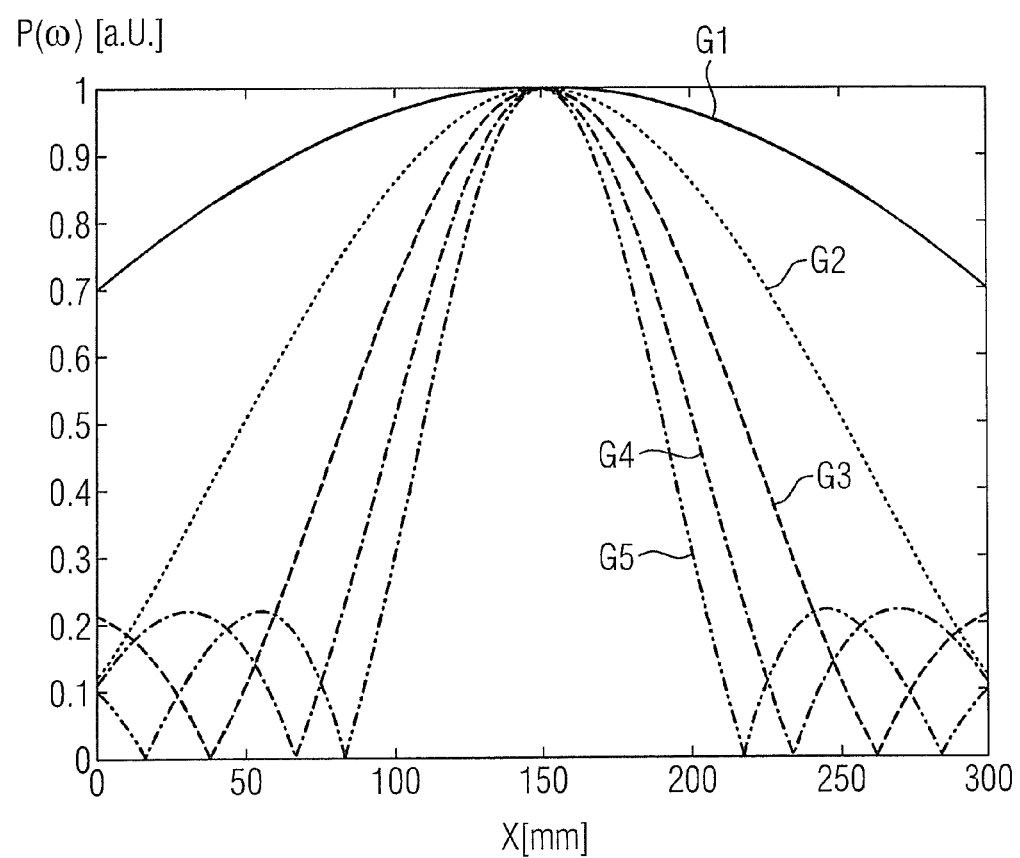
FIG. 1 shows the influence of the applied gradient strength on the excitation profile of an excitation pulse.

As an example, FIG. 1 illustrates the dependency of the excitation profile in x-direction (in millimeter "mm") and thus of the effected excitation $P(k,x)$ (in arbitrary units "a.u.") to a momentarily applied gradient strength G1, G2, G3, G4, G5. In the given example G5>G4>G3>G2>G1. As can be seen, the excitation profile becomes wider as the applied gradient strength is decreased. The widest excitation profile (depicted with a continuous line), which means an excitation (P(k,x)) that is as homogeneous as possible, stretching over the largest spatial area (x), is thus achieved at G1. The narrowest excitation profile (depicted with a double dotdashed line), which already accomplishes a significant change in the excitation (P(k,x)) at a low spatial change (x), is achieved at G5.

In general, the excitation profile of an excitation pulse theoretically corresponds to the Fourier-transformation of the pulse-shape of the excitation pulse in the time and space domain p(t). In the example depicted in FIG. 1, the excitation profiles correspond to a respective sinc-function, as they result in the "hard", rectangular-shaped excitation pulses p(t), which only exhibit a constant value, e.g. B1, which is not equal to zero, for the period τ of the excitation pulse.

A rectangular excitation pulse $$p(t) = \begin{cases} B1, & \text{for } |t| < \tau/2 \\ 0, & \text{otherwise} \end{cases}$$

corresponds to a sinc-shaped spectral excitation profile P(ω) in the frequency-domain with $$P(\omega) = \frac{\sin\left(\frac{1}{2}\omega\tau\right)}{\frac{1}{2}\omega\tau} = \text{sinc}\left(\frac{1}{2}\omega\tau\right) \text{ and a phase factor.}$$

The excitation profiles that are actually accomplished by the different magnetic resonance systems depend on the hardware and software that are employed in the pulse generation.

Figure 2:
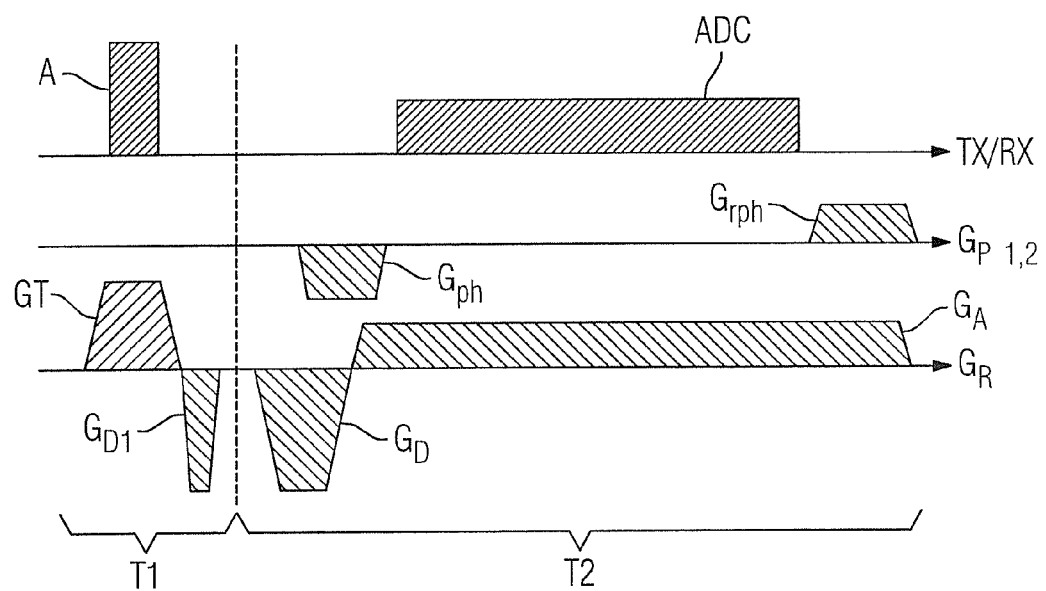
FIG. 2 schematically depicts a pulse sequence according to the invention.

FIG. 2 is a schematic depiction of the course of a test sequence according to the invention that is repeated in multiple repetitions, with which excitation profiles of excitation pulses A can be determined individually in a magnetic resonance apparatus. The excitation profiles, which are needed for the above-mentioned correction procedures, for example, can be easily adjusted to the actual conditions for each magnetic resonance apparatus. The upper axis TX/RX depicts the radio-frequency activity, in particular excitations and read-out processes. The second axis represents the gradients in the phase encoding direction P1 and P2. In the lower axis, the gradients are depicted in the read-out direction $G_R$.

Based on a known MR-sequence (e.g. TSE, GRE, . . . ), wherein generally a slice-selective, slab-selective or non-selective excitation is performed in the MR-examination, the excitation pulse of the known sequence is substituted with excitation pulse A that is used in the target-sequence (e.g. PETRA) that is to be measured, for example a rectangular pulse A, e.g. with a duration of 14 μs. Additionally, a test gradient GT is applied in one of the three spatial directions during the excitation pulse A. The measurement is superimposed in this direction with the excitation profiles of the excitation pulse (T1). Another gradient $G_{D1}$ can be applied for dephasing.

In the depicted example, a test gradient GT is activated in read-out direction. In this way, a high resolution can already be achieved within one read-out process ADC. When the test gradient GT is activated in the phase direction, a corresponding amount of phase encoding steps, and thus the same amount of repetitions, would be necessary for an equal resolution.

Depending on the strength of the test gradient GT during the excitation, the excitation profile (in the case of a rectangular excitation pulse A, a sinc-waveform) is expanded to varying widths in the read-out direction. In a preferred embodiment, it is expanded so much, for example, that it expands until the second minimum of the sinc waveform in the phantom. In this way, a characteristic area of the excitation profile is formed in the measured phantom, which is suitable for later use, e.g. for a correction procedure, as noted above.

In the further course of the test sequence, the known sequence can be maintained without any changes (T2). In the depicted example, the shown area T2 corresponds to a 3D GRE sequence with dephasing gradient $G_D$, phase encoding gradient $G_{ph}$, read-out gradient $G_A$ and rephasing gradient $G_{rph}$. If necessary, the gradients (in particular $G_{D1}$ and $G_D$) can be appropriately connected at the borders between the areas T1 and T2, in order to prevent noise and eddy currents from developing (not depicted).

FIG. 3 depicts a flowchart of an embodiment of the method according to the invention for the determination of excitation profiles from excitation pulses in a magnetic resonance system.

Therein, a homogeneous phantom is positioned within the measurement volume, preferably in the ISO-center of the magnetic resonance system, for which an excitation profile AP is to be produced (block 101). Depending on the expansion of the used phantom, a two-dimensional measurement can be performed at low depth of the phantom or a three-dimensional measurement (at greater depth of the phantom). In the following, the two-dimensional case is described preferably. The three-dimensional case takes place in the same manner.

With a test sequence according to the invention as described above, composed of an excitation pulse A as the excitation pulse, of which the excitation profile AP is to be determined, and wherein a test gradient GT is already activated at full strength while the excitation pulse A is irradiated, at least one set of measurement data MDS of the phantom is acquired (block 103). As noted above, the phantom is superimposed with the excitation profile of the excitation pulse A during the measurement in direction of the test gradient GT.

For example, at least two measurement data sets can be acquired here, and in these acquisitions, different gradients GT, $G_{ph}$ are activated, respectively.

For a test gradient GT in the read-out direction, in principal only a low resolution is necessary; in phase encoding direction, any resolution is possible. In order to increase the accuracy of the measurement, and in order to be less susceptible against coil intensity or excitation differences, it is possible, e.g., to perform one respective measurement data set automatically for all phase encoding steps of the test sequence. The intensity profiles IntP, which were determined from the respective measurement data sets, can be averaged for the determination of the excitation profile AP.

In further optional measurements, the examination can be repeated with other sectional orientations and expansions of the bandwidth profile, which means with different strengths of the test gradient, and one measurement data set can be acquired for each repetition.

One intensity profile is determined from at least one acquired measurement data set in the direction in which the test gradient was activated (block 105). For this purpose, an image is reconstructed from the at least one measurement data set, in which the phantom is reproduced. At a test gradient in the read-out direction, the intensity time curve of the reproduced phantom in the read-out direction can now be easily measured, as the intensity profile. This intensity time curve is thus simply obtained e.g. by placing a line in the read-out direction through the reproduced homogeneous phantom and by considering its intensity values. The determination of the intensity profile thus includes a determination of an intensity time curve within the reproduced phantom in the direction in which the test gradient was activated.

Such an intensity profile directly corresponds to the frequency-time curve of the excitation pulse A and thus to its excitation profile. Therefore, if only one measurement data set MDS is acquired, the determination of the intensity profile IntP already corresponds to the determination of the excitation profile AP (block 107). As described above, a more accurate excitation profile AP can be determined from several measurement data sets, by e.g. averaging the determined intensity profiles IntP. It is further possible to add an additional algorithm for the determination of the excitation profile AP, which detects, if the measured intensity profile was really measured within the phantom, or if noise was measured accidentally. At sharp edges of the profile, it can thus be detected when the transition from the phantom to noise occurred. In this way, an integration of the noise component into the evaluation can be avoided.

The excitation profile can thus be read-out parallel to the superimposition along a line within the respective direction, or it is also possible to read-out several lines with different resolutions and bandwidth coverages, which would be combined to an accurate excitation profile with a simultaneous suppression of a noise level.

The determined excitation profile can be saved or stored for further use such as being directly integrated into the post processing procedure (block 109).

By the specific superimposition of a homogeneous phantom onto the excitation profile of the desired excitation pulse and an automatic evaluation and integration of the determined excitation profile of the excitation pulse, it is possible to determine an accurate actual excitation profile for different magnetic resonance systems in a simple manner. In order to increase the measurement accuracy, it is possible to combine several measurements with different spatial orientations and bandwidth coverages. The determined result can automatically be integrated in the post processing, in particular in the above mentioned correction procedure.

The described procedure can be performed once for each magnetic resonance system- and software type, in regular intervals or before each measurement.

FIG. 4 is a schematic illustration of a magnetic resonance apparatus 23 according to the invention. As it is generally known, it includes a basic field magnet unit 24, which defines a patient receiving area 25, which can be designed with a surrounding radio-frequency coil arrangement, in particular a body coil 22, and a gradient coil arrangement. A patient or any other object that is to be examined, such as a phantom P, can be brought into the magnetic resonance device 23 in the patient receiving area 25, in particular on a patient bed L. A homogeneous phantom P can be used for the procedure according to the invention, which has a section that has a size extent in the slice direction that corresponds to the resolution of the magnetic resonance apparatus. By means of such a small extent, phantom P can be handled easily and can also be stowed without occupying a lot of space. For the procedure according to the invention, phantom P can be placed into the ISO-center, within the measurement volume M of the magnetic resonance device 23.

Further, the magnetic resonance apparatus 23 can have at least one further radio-frequency coil arrangement, which can be selectively placed at a desired location within the patient receiving area, namely a local coil 27. The local coil 27 can be composed of at least two individual coils with one respective reception channel, for example. The phantom can be measured with the body coil 22 or with the local coil 27, if their sensitivity distribution is known. The operation of the magnetic resonance apparatus 23 is controlled by a control computer 26, which is designed to perform the procedure according to the invention, in particular for the determination of excitation profiles e.g. for adjustments, as described above.

The procedure according to the invention is implemented, e.g., by a computer program according to the invention in a control computer 26 of the magnetic resonance device 23, that is executed in the control unit 26. The control computer 26 is thus programmed to perform a procedure according to the invention. For this purpose, an electronically readable data carrier 21, with electronically readable control information stored thereon, which at least includes such a computer program to perform a procedure according to the invention in order to correct artefacts in the described manner, is located in the control unit 26 of a magnetic resonance apparatus 23.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining an excitation profile of excitation pulses radiated in a magnetic resonance apparatus, comprising:
    placing a homogeneous phantom within a measurement volume of a magnetic resonance apparatus;
    acquiring at least one magnetic resonance measurement data set, having an intensity profile, from the phantom by operating the magnetic resonance apparatus according to a test pulse sequence that comprises an excitation pulse that produces an excitation profile in the phantom, and a test gradient that is activated at full strength while said excitation pulse is radiated;
    providing said measurement data set to a computerized processor and, in said processor, automatically determining the intensity profile of said at least one measurement data set in a direction in which said test gradient is activated;
    in said processor, determining said excitation profile, produced in the phantom by said excitation pulse, from the determined intensity profile; and
    making the determined excitation profile available in electronic form at an output of said processor.

2. A method as claimed in claim 1 comprising activating said test gradient in a readout direction along which said magnetic resonance data set is read out in said test sequence.

3. A method as claimed in claim 1 comprising determining said intensity profile by determining an intensity time curve within said phantom in said direction in which said test gradient is activated.

4. A method as claimed in claim 1 comprising operating said magnetic resonance apparatus with a strength of said test gradient in said test sequence selected to cause a characteristic area of said excitation profile to be reproduced in the measurement data set representing said phantom.

5. A method as claimed in claim 1 comprising operating said magnetic resonance apparatus to acquire at least two measurement data sets with said test sequence, with different gradients being activated in said test sequence respectively for acquiring said two measurement data sets, and determining said intensity profile from said at least two measurement data sets.

6. A method as claimed in claim 5 comprising determining said excitation profile from respective individual intensity profiles of said at least two different measurement data sets.

7. A method as claimed in claim 1 comprising radiating said excitation pulse as a rectangular pulse in said test sequence.

8. A method as claimed in claim 1 comprising employing, as said phantom, a phantom having a size in said direction in which said test gradient is activated that corresponds to a resolution of said magnetic resonance apparatus.

9. A magnetic resonance apparatus comprising:
a magnetic resonance data acquisition unit;
a homogeneous phantom placed within a measurement volume of the magnetic resonance apparatus;
a control unit configured to operate said data acquisition unit to acquire at least one magnetic resonance measurement data set, having an intensity profile, from the phantom according to a test pulse sequence that comprises an excitation pulse that produces an excitation profile in the phantom, and a test gradient that is activated at full strength while said excitation pulse is radiated;
a computerized processor provided with said measurement data set, said computerized processor being configured to automatically determine an intensity profile of said at least one measurement data set in a direction in which said test gradient is activated;
said computerized processor being configured to determine said excitation profile, produced in the phantom by said excitation pulse, from the determined intensity profile; and
said computerized processor being configured to make the determined excitation profile available in electronic form at an output of said processor.

10. A non-transitory, computer-readable data storage medium encoded with programming instructions, said storage medium being loaded into a computerized control computer of a magnetic resonance apparatus that also comprises a magnetic resonance data acquisition unit, said programming instructions causing said control computer to:
operate the data acquisition unit to acquire at least one magnetic resonance measurement data set, having an intensity profile, from a homogeneous phantom placed within a measurement volume of the data acquisition unit, according to a test pulse sequence that comprises an excitation pulse that produces an excitation profile in the phantom, and a test gradient that is activated at full strength while said excitation pulse is radiated;
determine the intensity profile of said at least one measurement data set in a direction in which said test gradient is activated;
determine the excitation profile, produced in the phantom by said excitation pulse from the determined intensity profile; and
make the determined excitation profile available in electronic form at an output of said processor.

\* \* \* \* \*